United States Patent
Tomiyoshi et al.

(10) Patent No.: US 6,399,677 B2
(45) Date of Patent: Jun. 4, 2002

(54) EPOXY RESIN COMPOSITIONS AND PREMOLDED SEMICONDUCTOR PACKAGES

(75) Inventors: Kazutoshi Tomiyoshi; Kazuhiro Arai; Toshio Shiobara, all of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/726,575

(22) Filed: Dec. 1, 2000

(30) Foreign Application Priority Data

Dec. 2, 1999 (JP) .............................. 11-342946
Nov. 28, 2000 (JP) ........................... 2000-360597

(51) Int. Cl.$^7$ .............................. C08K 3/36; C08L 63/02
(52) U.S. Cl. ..................... 523/466; 423/338; 524/492
(58) Field of Search .......................... 523/466; 423/335, 423/338, 339; 524/492

(56) References Cited

U.S. PATENT DOCUMENTS 4,683,128 A    7/1987  Orii et al.

FOREIGN PATENT DOCUMENTS

| JP | 798659 | 10/1995 |
| JP | 08157694 | * 6/1996 |
| JP | 2750254 | 2/1998 |

* cited by examiner

*Primary Examiner*—Robert Dawson
*Assistant Examiner*—D. Aylward
(74) *Attorney, Agent, or Firm*—Birch, Stewart, Kolasch & Birch, LLP

(57) ABSTRACT

In an epoxy resin composition comprising an epoxy resin, a curing agent, and an inorganic filler, the filler is porous silica having a specific surface area of 6–200 m$^2$/g, a true specific gravity of 2.0–2.2, and a mean particle size of 2–50 μm. The epoxy resin composition is readily moldable, has a low moisture permeability and reliability in the cured state, and is suitable for forming a premolded hollow semiconductor package.

13 Claims, 1 Drawing Sheet

EPOXY RESIN COMPOSITIONS AND PREMOLDED SEMICONDUCTOR PACKAGES

This invention relates to epoxy resin compositions which are easily moldable, have a low moisture permeability and reliability in the cured state, and are suitable for encapsulating semiconductor chips and especially as premolded hollow semiconductor packages. It also relates to premolded hollow semiconductor packages encapsulated with the epoxy resin compositions in the cured state.

BACKGROUND OF THE INVENTION

In the electrical and electronic fields, epoxy resins featuring mechanical strength, moisture resistance and moldability find a variety of applications as insulating materials, laminates, adhesives and semiconductor encapsulants.

As opposed to essentially moisture impermeable metals and ceramics, epoxy resins classified as thermosetting resins have a coefficient of moisture diffusion. Upon exposure to humid conditions, epoxy resins absorb moisture and allow moisture to permeate therethrough. The moisture permeability of thermosetting resins often becomes a problem when they are used in the application requiring hermetic and water-proof seals, for example, in precision machines such as watches and electronic calculators, and electronic parts such as semiconductor packages, especially solid state imaging device (generally known as CCD) hollow packages and quartz oscillator hollow packages. For example, resin packages of CCD slowly absorb moisture when exposed to a hot humid environment for an extended period of time, though not in direct contact with water. If moisture is introduced into the hermetic space in excess of the saturated steam amount determined from the saturated water vapor pressure, moisture condenses. The device becomes inoperable by dew condensation.

An improvement in moisture permeability has long been desired for prior art epoxy resin compositions comprising an epoxy resin, a curing agent and an inorganic filler for use in hollow packages. One known means is to add an inorganic desiccant to the epoxy resin composition so that the desiccant adsorbs moisture permeating through the cured item, preventing moisture from entering the hollow interior.

JP-A 8-157694 of the same assignee as the present invention discloses an epoxy resin composition comprising at least 10 parts by weight of an inorganic desiccant per 100 parts by weight of an epoxy resin and a curing agent combined. Specifically, using AMT silica by Mizusawa Chemical K.K. as the inorganic desiccant, the composition is rendered low moisture permeable.

AMT silica, however, has a low true specific gravity and contains a relatively large amount of ionic impurities since it is porous silica obtained by sintering zeolite. The low true specific gravity means that a certain weight of silica added accounts for a larger volume so that an increased amount of silica can obstruct flow. The large amount of ionic impurities interfere with the curing function of the curing catalyst so that cure may become short, resulting in drops of hot strength and bond strength.

JP 2,750,254 (JPA 6-232292) discloses a semiconductor package comprising an insulating substrate containing 0.1 to 50% by weight of a desiccant. The amount of desiccant added to an epoxy resin composition should preferably be increased since a small amount of desiccant does not fully adsorb moisture penetrating through the cured item. Illustratively, in a moisture permeation reliability test, a package sample containing a small amount of desiccant allows moisture to reach the cavity so that moisture may condense on the glass lid. This drawback can be eliminated by increasing the amount of desiccant. However, since conventional desiccants are poorly compatible with epoxy resins and curing agents, they exacerbate the flow particularly when added in large amounts. The epoxy resin composition with retarded flow can cause such defects as short shots and voids when molded by a transfer molding machine, and is thus unsuitable for semiconductor encapsulating purposes.

An object of the invention is to provide an epoxy resin composition which is flowable and easily moldable and cures into a product having a low moisture permeability, and a premolded hollow semiconductor package encapsulated with the epoxy resin composition in the cured state.

SUMMARY OF THE INVENTION

We have found that an epoxy resin composition comprising an epoxy resin, a curing agent, and an inorganic filler flows smoothly and is easily moldable when the filler is porous silica having a specific surface area of 6 to 200 m²/g, a true specific gravity of 2.0 to 2.2, and a mean particle size of 2 to 50 μm. The composition cures into a product of quality having a low moisture permeability. In summary, the composition is smoothly flowable and readily bondable and curable into a product having minimized moisture permeation. The composition is thus suited for forming premolded hollow semiconductor packages.

Accordingly the invention provides an epoxy resin composition comprising an epoxy resin, a curing agent, and an inorganic filler in the form of porous silica having a specific surface area of 6 to 200 m²/g, a true specific gravity of 2.0 to 2.2, and a mean particle size of 2 to 50 μm. In some preferred embodiments, the porous silica has been prepared by forming a silica gel having a weight average particle size of up to 50 μm by a sol-gel process, and firing the silica gel at a temperature of 700 to 1,200° C.; the porous silica has a moisture pickup of at least 0.3% by weight when kept at 25° C. and RH 70% for 24 hours; the porous silica contains up to 1 ppm of each of alkali and alkaline earth metals. The porous silica preferably accounts for 40 to 90% by weight, more preferably at least 55% by weight of the entire epoxy resin composition.

The invention also provides a premolded hollow semiconductor package encapsulated with a cured product of an epoxy resin composition comprising an epoxy resin, a curing agent, and an inorganic filler including a porous silica having a specific surface area of 6 to 200 m²/g, a true specific gravity of 2.0 to 2.2, and a mean particle size of 2 to 50 μm.

BRIEF DESCRIPTION OF THE DRAWING

The only FIGURE.

DESCRIPTION OF THE PREFERRED EMBODIMENT

Figure 1:
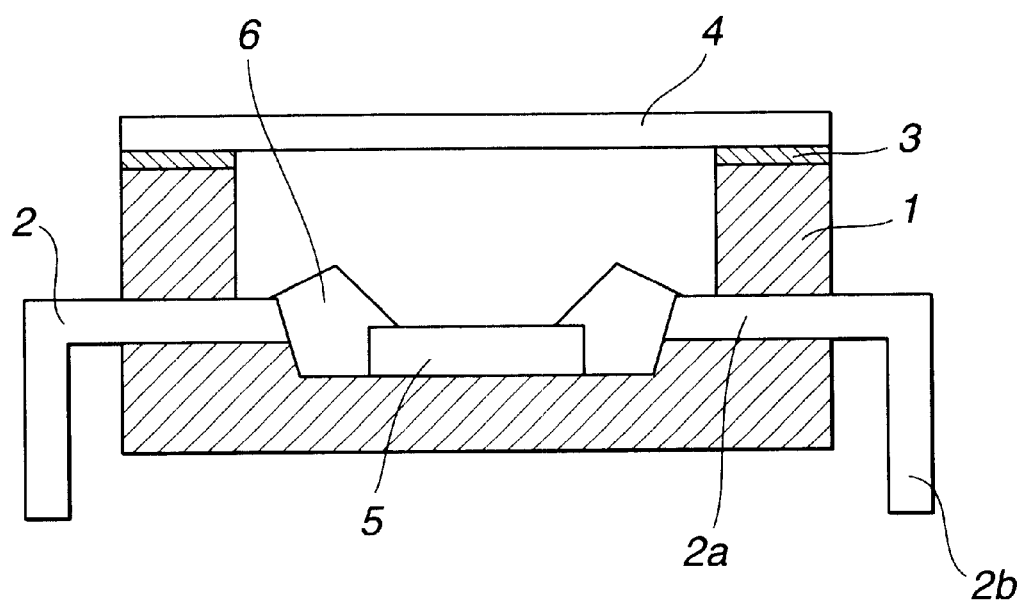
FIG. 1 is a schematic cross-sectional view of a premolded hollow semiconductor package molded in Examples.

The epoxy resin composition according to the invention contains an epoxy resin, a curing agent, and an inorganic filler. The epoxy resin used herein is not limited in molecular structure and molecular weight as long as it has at least two epoxy groups in a molecule and can be cured with curing agents to be described later. A proper choice may be made among conventional well-known epoxy resins. Examples of useful epoxy resins include bisphenol type epoxy resins such as bisphenol A type epoxy resins and bisphenol F type epoxy resins, novolak type epoxy resins such as phenol novolak type epoxy resins and cresol novolak type epoxy resins, triphenolalkane type epoxy resins such as triphenolmethane type epoxy resins and triphenolpropane type epoxy resins and polymers thereof, epoxy resins having a biphenyl skeleton, epoxy resins having a naphthalene skeleton, dicyclopentadiene-phenol novolak resins, phenolaralkyl type epoxy resins, glycidyl ester type epoxy resins, alicyclic epoxy resins, heterocyclic epoxy resins, and halogenated epoxy resins. Several preferred epoxy resins are illustrated by the following formulas although the epoxy resin is not limited thereto.

drides commonly used for the curing of conventional epoxy resins. Of these, phenolic resins having at least two phenolic hydroxyl groups per molecule are preferred. Exemplary curing agents include bisphenol type resins such as bisphenol A type resins and bisphenol F type resins; novolak-type phenolic resins such as phenolic novolak resins and cresol novolak resins; triphenolalkane resins such as triphenolmethane resins and triphenolpropane resins; resole type phenolic resins, phenol aralkyl resins, biphenyl type phenolic resins, naphthalene type phenolic resins, and cyclopentadiene type phenolic resins. These curing agents may be used alone or in admixture of two or more. Several preferred, non-limiting examples of the curing agent are given below.

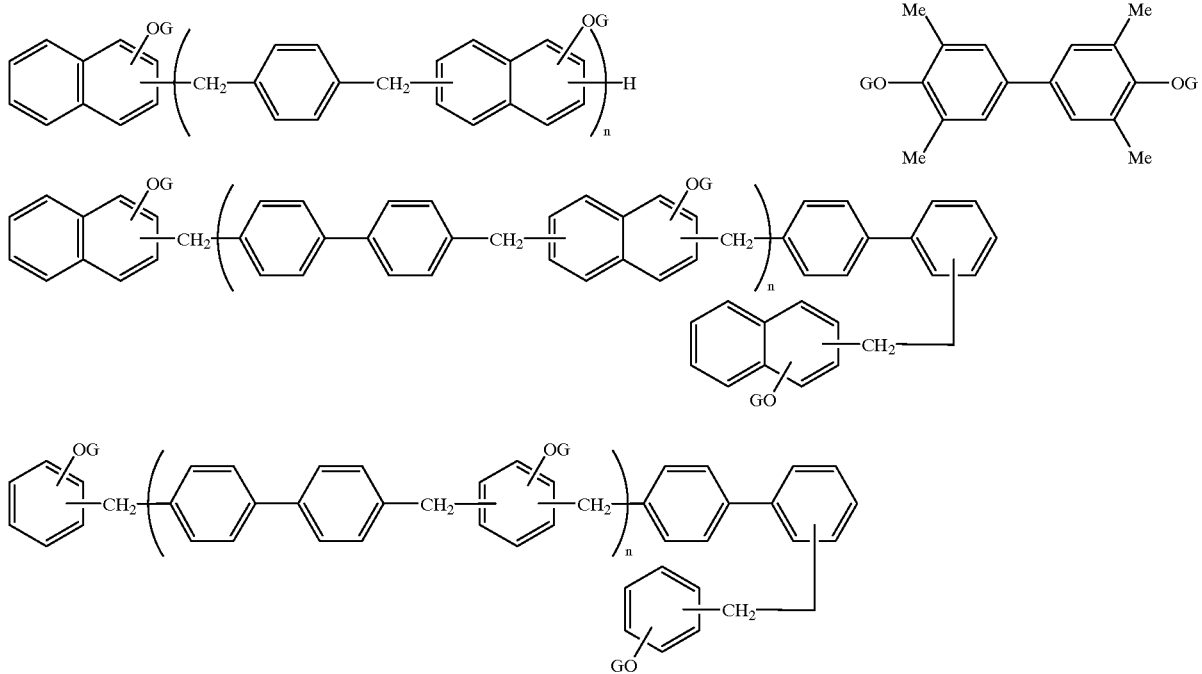

Herein, G is glycidyl, Me is methyl, and n is an integer of 0 to 10, and preferably 0 to 5.

The curing agent is not critical and may be any of phenolic compounds, amine compounds and acid anhy-

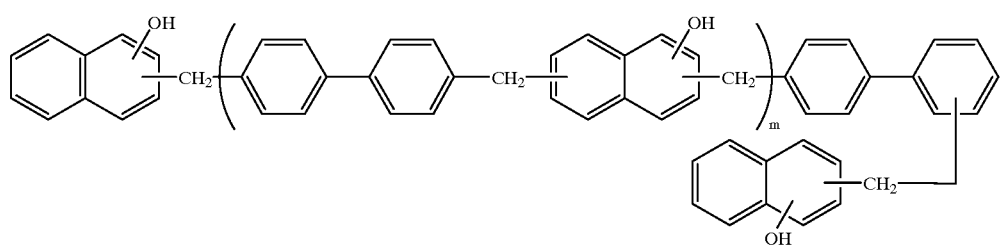

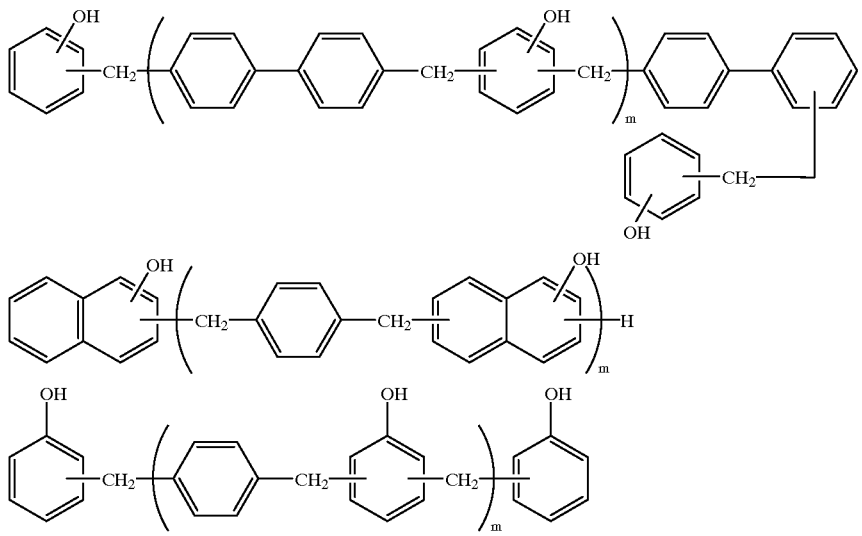

Herein, m is an integer of 0 to 10 and preferably 0 to 5.

The curing agent is blended in an effective amount to cause the epoxy resin to cure. When a phenolic resin is used as the curing agent, it is preferably blended in an epoxy resin in such amounts that 0.5 to 1.6 mol, more preferably 0.6 to 1.4 mol of phenolic hydroxyl groups are available per mol of epoxy groups. Less than 0.5 mol of hydroxyl groups have a possibility that more epoxy groups polymerize alone (homo-polymerization), resulting in a lower glass transition temperature. More than 1.6 mol means an excess of phenolic hydroxyl groups which may lower reactivity, resulting in a lower crosslinking density and insufficient strength.

The porous silica used herein as the inorganic filler should have a specific surface area of 6 to 200 m$^2$/g as expressed in BET specific surface by the nitrogen adsorption method, a true specific gravity of 2.0 to 2.2, and a mean particle size of 2 to 50 μm. It is noted that the mean particle size as used herein can be determined, for example, as the weight average (or median diameter) in the particle size distribution as measured by the laser light diffraction method.

More illustratively, the porous silica has a specific surface area of 6 to 200 m$^2$/g and preferably 20 to 150 m$^2$/g. Silica with a specific surface of less than 6 m$^2$/g has a poor water absorbing capacity whereas a specific surface of more than 200 m$^2$/g adversely affects the flow. The porous silica has a true specific gravity of 2.0 to 2.2. Silica with a true specific gravity of less than 2.0 has an insufficient degree of sintering and is less wettable to the epoxy resin. A true specific gravity of more than 2.2 indicates mixing of crystalline silica, which is outside the scope of porous silica which is amorphous. Additionally the porous silica has a mean particle size of 2 to 50 μm and preferably 4 to 20 μm. Outside this range, there can arise some problems including retarded flow and burr formation.

In the porous silica, the content of each of alkali metals such as Na and K and alkaline earth metals such as Mg and Ca should preferably be 1 ppm or lower. Most preferably the total content of alkali and alkaline earth metals is 1 ppm or lower. A higher content of such ionic impurities can reduce the activity of the curing catalyst, resulting in undercure. In a composition having a large amount of porous silica added, this tendency becomes outstanding if the content of ionic impurities is high.

Also preferably, the porous silica itself has a water absorbing capacity corresponding to a moisture pickup of at least 0.3%, more preferably at least 0.4%, and most preferably at least 1.0% by weight when kept at 25° C. and RH 70% for 24 hours. If the moisture pickup of porous silica is less than 0.3% by weight, the composition filled therewith may have an insufficient water absorbing capacity.

Further preferably the porous silica has a pore volume of 0.05 to 10 ml/g, more preferably of 0.1 to 1.0 ml/g and a pore diameter of 3 to 100 Å.

In one preferred embodiment, the porous silica is prepared by forming a silica gel having a weight average particle size of up to 50 μm by a sol-gel process, and firing the silica gel at a temperature of 700 to 1,200° C. The sol-gel process used herein may be any of the methods described in JP-B 7-98659, JP-A 62-283809 and JP-A 62-3011 both corresponding to U.S. Pat. No. 4,683,128, for example. Depending on its preparation method, the porous silica takes the form of spherical particles or fragments. For example, spherical porous silica is obtained by forcedly agitating an aqueous alkali metal silicate emulsion in the presence of a surfactant, followed by water washing, drying, and sintering. Fragment porous silica is obtained by extruding an aqueous alkali metal silicate emulsion into a water-miscible organic solvent or acid solution through orifices, treating the resulting fibrous coagulums with an acidic solution, washing them with water to extract impurities away, followed by pulverization and sintering.

The preferred conditions under which the porous silica obtained by the sol-gel process is fired include a temperature of about 700 to 1,200° C., more preferably about 800 to 1,100° C. and a time of about 2 to 16 hours, more preferably about 4 to 12 hours. If the firing temperature is below 700° C. or the firing time is too short, silica is sintered to an insufficient extent to be wettable to the epoxy resin and curing agent, failing to provide smooth flow. If the firing temperature is above 1,200° C. or the firing time is too long, the number of pores on the silica surface is reduced due to over-sintering so that the silica may have a low water absorbing capacity.

As mentioned above, the porous silica used herein is in the form of spherical particles or fragments. Spherical particles are preferred when the composition flow is taken into account. Silica fragments are preferred for the mechanical strength of the composition in the cured state. Since spherical particles are superior to fragments with respect to the water absorbing capacity of porous silica, it is preferred for increasing the water absorbing capacity to add spherical particles more. It is noted that the magnitude of water absorbing capacity depends on the size of pores. The proportion of spherical particles and fragments is not critical although a weight ratio of fragments/spherical particles in the range from 0/10 to 3/7 is preferred for a good balance of flow and strength. Particularly when a large amount of porous silica is added, it is recommended to increase the proportion of spherical particles.

The amount of porous silica added is preferably 40 to 90%, more preferably 50 to 90%, most preferably 55 to 80% by weight of the entire epoxy resin composition. If the amount of porous silica added is less than 40% by weight, the composition may sometimes have a poor capacity to trap externally penetrating water, failing to achieve the desired low moisture permeability. If the amount of porous silica added is greater than 90% by weight, the composition may become less flowable and difficult to mold.

While it is essential that the porous silica be used as the inorganic filler, other inorganic fillers may be additionally blended in the epoxy resin composition of the invention. Such other inorganic fillers include fused silica as milled in a ball mill, spherical silica obtained by flame fusion, crystalline silica, fumed silica, precipitated silica, alumina, boron nitride, aluminum nitride, silicon nitride, magnesia, and magnesium silicate. Preferably, the other inorganic filler, if any, is used in such amounts that the total of inorganic fillers (inclusive of the inventive porous silica) may be 100 to 1,000 parts by weight per 100 parts by weight of the epoxy resin and curing agent combined. If the total amount is less than 100 parts, the composition may have a higher coefficient of expansion. If the total amount is more than 1,000 parts, the composition may become too viscous to mold. More preferably the total amount is 200 to 900 parts by weight.

For enhancing the bond strength of the inorganic filler to the resin, the inorganic filler is preferably surface treated beforehand with coupling agents such as silane and titanate coupling agents. Preferred coupling agents are silane coupling agents in the form of alkoxysilanes having alkyl groups substituted with such functional groups as epoxy, amino and mercapto groups, including epoxy silanes such as γ-glycidoxypropyltrimethoxysilane, γ-glycidoxypropylmethyldiethoxysilane, and β-(3,4-epoxycyclohexyl)ethyltrimethoxysilane; aminosilanes such as N-β-(aminoethyl)-γ-aminopropyltrimethoxysilane, γ-aminopropyltriethoxysilane, and N-phenyl-γ-aminopropyltrimethoxysilane; and mercaptosilanes such as γ-mercaptosilanes. No particular limitation is imposed on the amount of coupling agent used for surface treatment or the method of surface treatment.

In the inventive composition, conventional well-known silicone rubber and gel in powder form, silicone-modified epoxy resins, silicone-modified phenolic resins, and thermoplastic resins such as methyl methacrylate-butadiene-styrene copolymers may be added as stress-relieving agents and adhesives.

In the practice of this invention, a curing accelerator is preferably used for promoting the curing reaction between the epoxy resin and the curing agent. The curing accelerator may be any suitable substance that promotes the curing reaction. Illustrative, non-limiting examples of curing accelerators that may be used include organic phosphorus compounds such as triphenylphosphine, tributylphosphine, tri(p-methylphenyl)phosphine, tri(nonylphenyl)phosphine, triphenylphosphine triphenyl-borate, and tetraphenylphosphine tetraphenylborate; tertiary amine compounds such as triethylamine, benzyldimethylamine, α-methylbenzyldimethylamine, and 1,8-diazabicyclo[5.4.0]-undecene-7; and imidazole compounds such as 2-methyl-imidazole, 2-phenylimidazole, and 2-phenyl-4-methyl-imidazole. An appropriate amount of the curing accelerator is about 0.01 to 10 parts by weight per 100 parts by weight of the epoxy resin and curing agent (e.g., phenolic resin) combined.

The epoxy resin composition may further include various additives, if necessary. Illustrative examples include coupling agents such as silane, titanium and aluminum coupling agents; colorants such as carbon black; parting agents such as natural wax; wetting modifiers such as fluorochemical surfactants and silicone oil; and halogen trapping agents.

The epoxy resin composition may be prepared by uniformly mixing the essential and optional ingredients in a high-speed mixer or other appropriate apparatus, and fully milling the mixture in a roll mill or continuous kneader. The desired milling temperature is about 50 to 120° C. After milling, the compound is sheeted, cooled and ground. The resulting epoxy resin composition is useful as a general molding material and especially a semiconductor encapsulant.

The epoxy resin composition of the invention can be effectively used for encapsulating various types of semiconductor devices, and especially for forming premolded hollow packages. The method of encapsulation most commonly used is low-pressure transfer molding. The epoxy resin composition is preferably molded at a temperature of about 150 to 180° C. for a period of about 30 to 180 seconds, followed by postcuring at about 150 to 180° C. for about 2 to 16 hours.

In the premolded hollow semiconductor package of the present invention, the package is encapsulated with a cured product of an epoxy resin composition comprising an epoxy resin, a curing agent, and an inorganic filler. The inorganic filler includes a porous silica having a specific surface area of 6 to 200 $m^2$/g, a true specific gravity of 2.0 to 2.2, and a mean particle size of 2 to 50 μm, as described above. The amount of the porous silica in the cured product or the entire epoxy resin composition is described above and preferably at least 55% by weight.

EXAMPLE

Examples of the invention are given below by way of illustration and not by way of limitation. All parts are by weight.

Examples 1–10 and Comparative Examples 1–4

Semiconductor-encapsulating epoxy resin compositions were prepared by mixing the porous silica shown in Table 1 with the ingredients shown in Tables 2 and 3, and uniformly melt milling the mixture in a hot two-roll mill, followed by cooling and grinding.

These epoxy resin compositions were examined for various properties by the following tests (1) to (9). The results are also shown in Tables 2 and 3.

(1) Spiral Flow:

The spiral flow was measured by molding the composition at 175° C. and 6.9 N/mm² for 120 seconds in a mold in accordance with EMMI standards.

(2) Gel time

The gel time was measured as the time until the epoxy resin composition gelled on a hot plate at 175° C.

(3) Melt viscosity

The melt viscosity was measured at 175° C. under a load of 10 kg with a constant-load orifice-type flow testing apparatus of the kind known in Japan as a Koka-type flow tester (Shimadzu Mfg. K.K.).

(4) Hardness as molded

According to JIS K6911, a rod measuring 100×10×4 mm was molded at 175° C. and 6.9 N/mm² for 120 seconds. The hardness when hot was measured with a Barcol Impressor.

(5) Flexural strength

According to JIS K6911, a rod measuring 100×10×4 mm was molded at 175° C. and 6.9 N/mm² for 120 seconds and cured at 180° C. for 4 hours before it was measured for flexural strength.

(6) Adhesion

A shear bond strength test piece was prepared by molding the composition over a frame of Alloy 42 at 175° C. and 6.9 N/mm² for 120 seconds and curing at 180° C. for 4 hours. A bonding force was measured. The bond area between the frame and the resin was 10 mm².

(7) Moisture pickup

A disc having a diameter of 50 mm and a thickness of 3 mm was molded at 175° C. and 6.9 N/mm² for 120 seconds and cured at 180° C. for 4 hours. The disc was held at 85° C. and RH 85% for 48 hours before the amount of water absorbed was measured.

(8) Thermal conductivity

A disc having a diameter of 50 mm and a thickness of 3 mm was molded at 175° C. and 6.9 N/mm² for 120 seconds and cured at 180° C. for 4 hours. Thermal conductivity was measured in accordance with ASTM E 1530 using ANTAR 2021.

(9) Hermetic test

A premolded package 1 of hollow box shape as shown in FIG. 1 was prepared by molding the epoxy resin composition over a lead frame 2 (including inner and outer leads 2a and 2b) at 175° C. and 6.9 N/mm² for 120 seconds and postcuring at 180° C. for 4 hours. A transparent glass shield 4 was joined to the top of the package 1 with an epoxy resin adhesive 3, completing the hollow package. Note that a semiconductor chip 5 and metal bonding wires 6 are on the lead frame 2.

This package was subjected to a thermal cycling test. The test procedure included four steps of (1) holding in an atmosphere of 121° C./RH 100%/2 atm. for 4 hours, (2) holding at room temperature (25° C.) for 30 minutes, (3) placing the glass shield in contact with a hot plate at 100° C. for 10 seconds, and (4) placing the glass shield in contact with an iron plate at room temperature for 7 seconds. This was repeated four cycles. It was observed whether or not the glass shield was clouded by dew condensation. The sample was rated "NG? when dew condensation occurred in the first cycle, and "1," "2," "3" and "4" when it cleared the first, second, third and fourth cycle, respectively.

TABLE 1

| Porous silica | Used in Example | | | | Used in Comparative Example | |
|---|---|---|---|---|---|---|
| | 1 | 2 | 3 | 4 | 5 | AMT#2000 |
| Shape | spherical | spherical | spherical | fragment | spherical | — |
| Sintering temp. (° C.) | 800 | 900 | 980 | 1,100 | 1,250 | — |
| Mean particle size (μm) | 8.7 | 9.6 | 16 | 31 | 15 | 2 |
| Specific surface(m²/g) | 144 | 75 | 21 | 35 | 4 | 125 |
| Moisture pickup @ 25° C./RH70%/24 hr (wt %) | 15 | 7.4 | 3.4 | 0.48 | 0.2 | 17 |
| Extracted water pH | 4.4 | 4.4 | 4.5 | 4.4 | 4.5 | 5.8 |
| True specific gravity (g/cm³) | 2.1 | 2.2 | 2.2 | 2.2 | 2.2 | 1.9 |
| Specific gravity ratio to specific gravity 2.20 fused silica | 0.95 | 1.00 | 1.00 | 1.00 | 1.00 | 0.86 |
| Al content (ppm) | 1.0 | 1.2 | 1.0 | 0.9 | 0.9 | 1,100 |
| Fe content (ppm) | 2.1 | 2.0 | 2.3 | 2.0 | 2.3 | 25 |
| Total content of alkali metal (Na and K) (ppm) | <1 | <1 | <1 | <1 | <1 | 243 |
| Total content of alkali earth metal (Mg and Ca) (ppm) | <1 | <1 | <1 | <1 | <1 | 364 |
| U content (ppb) | 0.1 | 0.1 | 0.1 | 0.1 | 0.1 | 1.4 |

Note that porous silica Nos. 1 to 5 were respectively prepared by forming a silica gel having a weight average particle size of 9.2 μm, 10 μm, 17 μm, 32 μm and 13 μm by the sol-gel process, and firing the silica gel at the indicated temperature for 8 hours. The contents of Al, Fe, Na, Ca, Mg and K were measured by ICP, and the content of U was measured by fluorescent x-ray analysis. Porous silica Nos. 1 to 4 were used in Examples and porous silica No. 5 and AMT #2000 (zeolite by Mizusawa Chemical K.K.) were used in Comparative Examples.

TABLE 2

| Formulation (pbw) | Example 1 | Example 2 | Example 3 | Example 4 | Example 5 | Comparative Example 1 | Comparative Example 2 |
|---|---|---|---|---|---|---|---|
| Novolak type epoxy resin[1] | 59.1 | 59.1 | 59.1 | 59.1 | 59.1 | 59.1 | 59.1 |
| Curing agent[3] | 35.4 | 35.4 | 35.4 | 35.4 | 35.4 | 35.4 | 35.4 |
| Brominated epoxy resin[5] | 5 | 5 | 5 | 5 | 5 | 5 | 5 |
| Silane coupling agent[6] | 1.5 | 1.5 | 1.5 | 1.5 | 1.5 | 1.5 | 1.5 |
| Hoechst Wax E | 1.5 | 1.5 | 1.5 | 1.5 | 1.5 | 1.5 | 1.5 |
| Triphenylphosphine | 1.3 | 1.3 | 1.3 | 1.3 | 1.3 | 1.3 | 1.3 |
| $Sb_2O_3$ | 5 | 5 | 5 | 5 | 5 | 5 | 5 |
| Porous silica No. 1 | 346 | — | — | 277 | 277 | — | — |
| Porous silica No. 2 | — | 346 | — | — | — | — | — |
| Porous silica No. 3 | — | — | 346 | — | — | — | — |
| Porous silica No. 4 | — | — | — | 69 | — | — | — |
| Porous silica No. 5 | — | — | — | — | — | 346 | — |
| AMT #2000 | — | — | — | — | — | — | 346 |
| Spherical silica[7] | 18 | 18 | 18 | 18 | 18 | 18 | 18 |
| Micro-spherical silica[8] | 104 | 104 | 104 | 104 | 104 | 104 | 104 |
| Micro-spherical silica[9] | 52 | 52 | 52 | 52 | 52 | 52 | 52 |
| Spherical alumina[10] | — | — | — | — | 69 | — | — |
| Porous silica content (wt %) | 55 | 55 | 55 | 55 | 44 | 55 | — |
| Spiral flow (cm) | 95 | 105 | 110 | 95 | 96 | 106 | 32 |
| Gel time (sec) | 16 | 16 | 15 | 16 | 15 | 16 | 20 |
| Melt viscosity (Pa · s) | 20 | 18 | 18 | 20 | 16 | 18 | 500 |
| Molded hardness | 85 | 87 | 85 | 85 | 86 | 87 | 75 |
| Flexural strength ($N/mm^2$) | 142 | 142 | 132 | 142 | 142 | 142 | 108 |
| Bonding force (kg) | 4.2 | 4.1 | 3.9 | 4.3 | 4.0 | 3.8 | 0.2 |
| Moisture pickup (wt %) | 3.0 | 2.3 | 2.1 | 1.8 | 1.8 | 1.0 | 3.0 |
| Thermal conductivity (W/mK) | 0.9 | 0.9 | 0.9 | 0.9 | 1.4 | 0.9 | 0.9 |
| Hermetic test | 4 | 4 | 4 | 4 | 3 | NG | 1 |

TABLE 3

| Formulation (pbw) | Example 6 | Example 7 | Example 8 | Example 9 | Example 10 | Comparative Example 3 |
|---|---|---|---|---|---|---|
| Novolac type epoxy resin[1] | 59.1 | 59.1 | 59.1 | 59.1 | — | 59.1 |
| Biphenyl type epoxy resin[2] | — | — | — | — | 45.6 | — |
| Curing agent[3] | 35.4 | 35.4 | 35.4 | 35.4 | — | 35.4 |
| Curing agent[4] | — | — | — | — | 47.0 | — |
| Brominated epoxy resin[5] | 5 | 5 | 5 | 5 | 5 | 5 |
| Silane coupling agent[6] | 1.5 | 1.5 | 1.5 | 1.5 | 1.5 | 1.5 |
| Hoechst Wax E | 1.5 | 1.5 | 1.5 | 1.5 | 1.5 | 1.5 |
| Triphenylphosphine | 1.3 | 1.3 | 1.3 | 1.3 | 1.3 | 1.3 |
| $Sb_2O_3$ | 5 | 5 | 5 | 5 | 5 | 5 |
| Porous silica No. 1 | 63 | 315 | 378 | 362 | 472.5 | — |
| Spherical silica[7] | 301 | 49 | — | 56 | 73.5 | 364 |
| Micro-spherical silica[8] | 104 | 104 | 90 | 120 | 156 | 104 |
| Micro-spherical silica[9] | 52 | 52 | 52 | 60 | 78 | 52 |
| Porous silica content (wt %) | 10 | 50 | 60 | 51 | 53 | — |
| Spiral flow (cm) | 115 | 112 | 90 | 95 | 100 | 120 |
| Gel time (sec) | 16 | 16 | 16 | 16 | 16 | 16 |
| Melt viscosity (Pa · s) | 19 | 18 | 21 | 16 | 18 | 14 |
| Molded hardness | 85 | 86 | 87 | 86 | 85 | 86 |
| Flexural strength ($N/mm^2$) | 142 | 137 | 147 | 147 | 147 | 137 |
| Bonding force (kg) | 4.1 | 3.9 | 3.9 | 4.2 | 4.0 | 2.8 |
| Moisture pickup (wt %) | 0.7 | 3.1 | 3.3 | 2.6 | 2.2 | 0.4 |
| Hermetic test | 1 | 3 | 4 | 3 | 3 | NG |

Note:
[1] Novolac type epoxy resin: Nippon Kayaku K.K., EOCN 4400, epoxy equivalent 190
[2] Biphenyl type epoxy resin: Yuka Shell K.K., YX-4000HK, epoxy equivalent 190
[3] Curing agent: Meiwa Chemical K.K., phenol novolak resin DL-92L, phenol equivalent 110
[4] Curing agent: Mitsui Toatsu K.K., Thylox resin (phenol aralkyl resin) XL-225-3L, phenol equivalent 168
[5] Brominated epoxy resin: Nippon Kayaku K.K., BREN-105, epoxy equivalent 280
[6] Silane coupling agent: Shin-Etsu Chemical Co., Ltd., KBM-403
[7] Spherical silica: mean particle size 12 μm, a fraction of greater than 50 μm coarse particles less than 0.5 wt % (Sierus laser method)
[8] Micro-spherical silica: mean particle size 2 μm, Adomatech, SO-32R
[9] Micro-spherical silica: mean particle size 0.5 μm, Adomatech. SO-25R
[10] Spherical alumina: mean particle size 20 μm, Tatsumori K.K.

The epoxy resin compositions within the scope of the invention and the semiconductor packages encapsulated therewith exhibit excellent properties as demonstrated by the above Examples. It is seen from Table 2 that when silica having a smaller specific surface area and a smaller moisture pickup is used, the hollow package does not provide a satisfactory hermetic seal in the hermetic test. When conventional porous silica (zeolite) is used, flow, cure, adhesion and hermetic seal are unsatisfactory under the influence of impurities. It is seen from Table 3 that when porous silica within the scope of the invention is used, but in a smaller amount, the results of the hermetic test are unsatisfactory. The hermetic level rises as the amount of porous silica added increases.

There has been described a porous silica-loaded epoxy resin composition which is easy to mold and cures into a part having low moisture permeability and high reliability.

Japanese Patent Application No. 11-342946 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An epoxy resin composition comprising an epoxy resin, a curing agent, and an inorganic filler in the form of porous silica having a specific surface area of 6 to 200 m²/g, a true specific gravity of 2.0 to 2.2, and a mean particle size of 2 to 50 μm.

2. The epoxy resin composition of claim 1 wherein the porous silica accounts for 40 to 90% by weight of the entire epoxy resin composition.

3. The epoxy resin composition of claim 1 wherein the porous silica has been prepared by forming a silica gel having a weight average particle size of up to 50 μm by a sol-gel process, and firing the silica gel at a temperature of 700 to 1,200° C.

4. The epoxy resin composition of claim 1 wherein the porous silica has a moisture pickup of at least 0.3% by weight when kept at 25° C. and RH 70% for 24 hours.

5. The epoxy resin composition of claim 1 wherein the porous silica contains up to 1 ppm of each of alkali and alkaline earth metals.

6. The epoxy resin composition of claim 1, wherein the epoxy resin is illustrated by one of the following formulas:

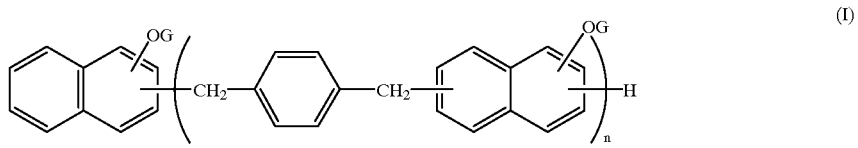

(I)

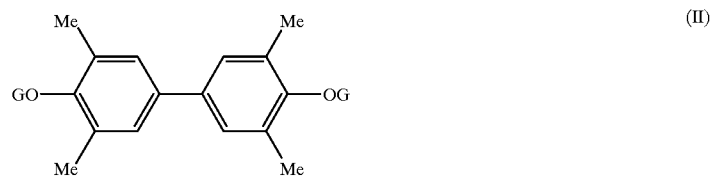

(II)

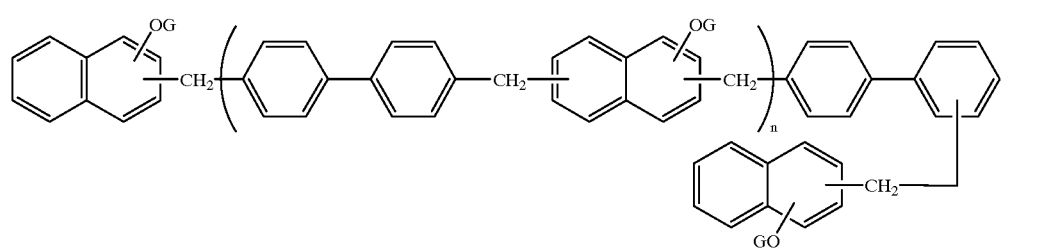

(III)

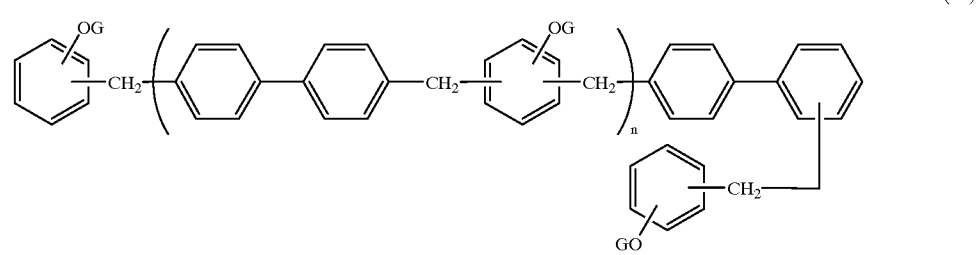

(IV)

wherein G is glycidyl, Me is methyl, and n is an integer of 0 to 10.

7. The epoxy resin composition of claim 1, wherein the curing agent is illustrated by one of the following formulas: wherein m is an integer of 0 to 10.

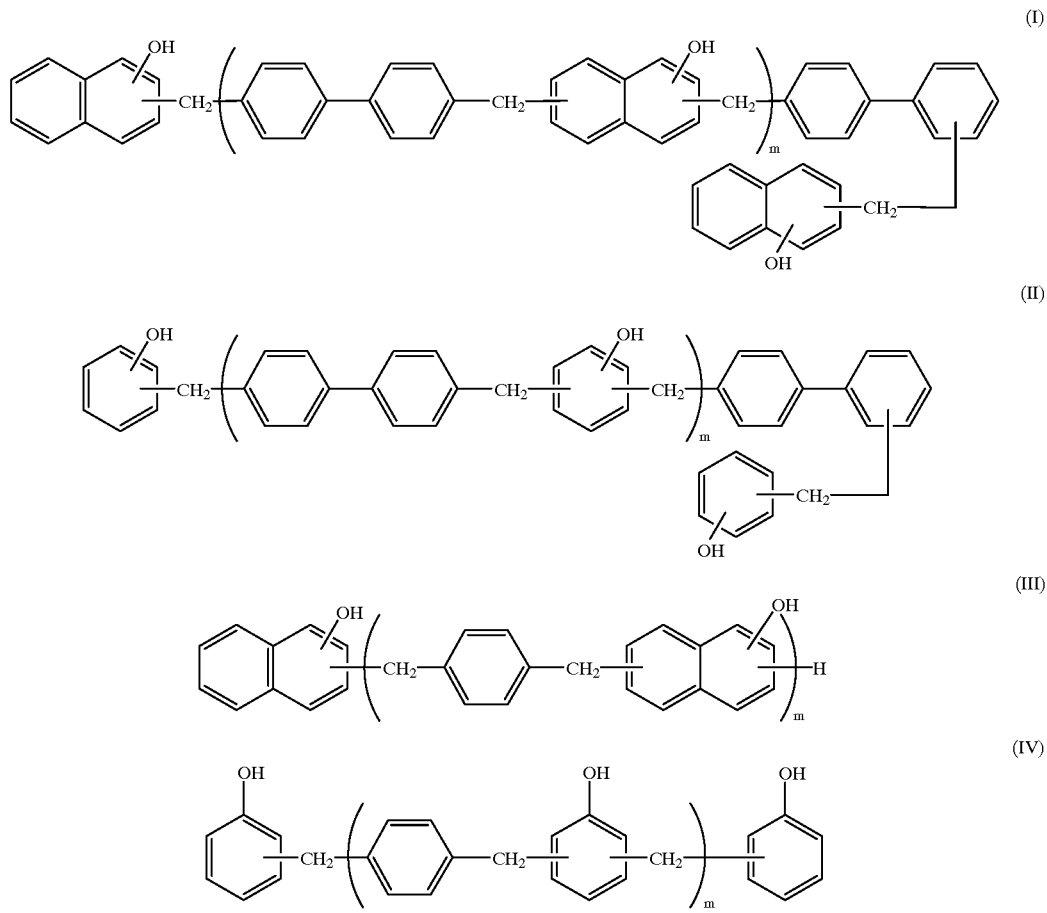

8. The epoxy resin composition of claim 1, wherein the specific surface area is 20 to 150 m²/g.

9. The epoxy resin composition of claim 1, wherein the mean particle size is 4 to 20 μm.

10. The epoxy resin composition of claim 1 or 2, wherein the porous silica accounts for 55 to 90% by weight of the entire epoxy resin composition.

11. The epoxy resin composition of claim 1, wherein the porous silica has a pore volume of 0.05 to 10 ml/g and a pore diameter of 3 to 100 Å.

12. The epoxy resin composition of claim 3, wherein the firing of the silica gel is at a temperature of 800 to 1,100° C.

13. The epoxy resin composition of claim 1, further comprising at least one of the following: a coupling agent, a colorant, a parting agent, a wetting modifier, and a halogen trapping agent.

* * * * *